(12) United States Patent
Jaini et al.

(10) Patent No.: US 10,739,403 B1
(45) Date of Patent: Aug. 11, 2020

(54) SYNCHRONIZED CLOCKS TO DETECT INTER-CLOCK DOMAIN TRANSITION DEFECTS

(71) Applicant: Ambarella International LP, Santa Clara, CA (US)

(72) Inventors: Praveen Kumar Jaini, Sunnyvale, CA (US); Karthik Narayanan Subramanian, San Jose, CA (US); SriHari Raju Saripella, San Jose, CA (US)

(73) Assignee: Ambarella International LP, Santa Clara, CA (US)

( * ) Notice: Subject to any disclaimer, the term of this patent is extended or adjusted under 35 U.S.C. 154(b) by 47 days.

(21) Appl. No.: 16/054,000

(22) Filed: Aug. 3, 2018

(51) Int. Cl.
*G01R 31/28* (2006.01)
*G01R 31/3185* (2006.01)
*G01R 31/317* (2006.01)
*G01R 31/3177* (2006.01)

(52) U.S. Cl.
CPC . *G01R 31/318552* (2013.01); *G01R 31/3177* (2013.01); *G01R 31/31726* (2013.01)

(58) Field of Classification Search
CPC ...... G01R 31/318552; G01R 31/31726; G01R 31/3177; G01R 31/318594; G01R 31/31727; G01R 31/318536; G01R 31/318558; G01R 31/318555; G01R 31/31725
See application file for complete search history.

(56) References Cited

U.S. PATENT DOCUMENTS

| 2003/0115524 | A1* | 6/2003 | Johnston | G01R 31/31727 714/726 |
| 2006/0107145 | A1* | 5/2006 | Athavale | G01R 31/318594 714/727 |
| 2011/0264971 | A1* | 10/2011 | Bahl | G01R 31/318594 714/731 |
| 2012/0124423 | A1* | 5/2012 | Chakravadhanula | G01R 31/31727 714/27 |
| 2012/0173943 | A1* | 7/2012 | Cesari | G01R 31/318552 714/731 |
| 2019/0101590 | A1* | 4/2019 | Sarda | G01R 31/318558 |

* cited by examiner

*Primary Examiner* — Guerrier Merant
(74) *Attorney, Agent, or Firm* — Christopher P. Maiorana, PC

(57) ABSTRACT

An apparatus includes a first circuit and a second circuit. The first circuit may be configured to generate a launch signal synchronized with a first clock signal in a first clock domain. The second circuit may be configured to (i) receive a second clock signal in a second clock domain and (ii) generate a plurality of pulses in each of a third clock signal and a fourth clock signal based on the second clock signal and the launch signal. A frequency of the pulses in the fourth clock signal may be an integer multiple of another frequency of the pulses in the third clock signal. An initial one of each of the pulses in the third clock signal and the fourth clock signal may be synchronized with each other.

20 Claims, 5 Drawing Sheets

US 10,739,403 B1

SYNCHRONIZED CLOCKS TO DETECT INTER-CLOCK DOMAIN TRANSITION DEFECTS

FIELD OF THE INVENTION

The invention relates to fault detection generally and, more particularly, to a method and/or apparatus for implementing synchronized clocks to detect inter-clock domain transition defects.

BACKGROUND

Stuck-at fault models are conventionally used to detect faults that behave as if a gate or wire is tied to power or ground. Transition fault models are used to detect faults that cause extra delays in circuitry. Two clock pulses are used to detect a transition fault within each clock domain. An initial pulse launches the transition that activates the fault and a subsequent pulse captures the fault effect of the transition.

If a frequency of the clock is low (typically less than 200 megahertz (MHz)), the launch pulses and the capture pulses are supplied from chip pins. Due to limitations of tester electronics and speeds of the chip pins, generation of the launch pulses and the capture pulses is commonly performed on-chip if the clock frequency is greater than 200 MHz. Most conventional clock control circuits are limited to generating pulses for a single clock domain. However, the pulses generated on-chip by several clock control circuits in several clock domains are often asynchronous with each other making the inter-clock domain transition testing difficult.

It would be desirable to implement synchronized clocks to detect inter-clock domain transition defects.

SUMMARY

The invention concerns an apparatus including a first circuit and a second circuit. The first circuit may be configured to generate a launch signal synchronized with a first clock signal in a first clock domain. The second circuit may be configured to (i) receive a second clock signal in a second clock domain and (ii) generate a plurality of pulses in each of a third clock signal and a fourth clock signal based on the second clock signal and the launch signal. A frequency of the pulses in the fourth clock signal may be an integer multiple of another frequency of the pulses in the third clock signal. An initial one of each of the pulses in the third clock signal and the fourth clock signal may be synchronized with each other.

BRIEF DESCRIPTION OF THE FIGURES

Embodiments of the invention will be apparent from the following detailed description and the appended claims and drawings in which:

DETAILED DESCRIPTION OF THE EMBODIMENTS

Embodiments of the present invention include providing synchronized clocks to detect inter-clock domain transition defects that may (i) be used to detect transition faults between divided clock domains, (ii) be used to detect transition faults within clock domains, (iii) operate with a single divided clock, (iv) operate with multiple divided clocks, (v) use a dedicated launch trigger, (vi) generate synchronized pulses in each clock domain, (vii) provide physical-design friendly circuits, (viii) minimize an impact of handling clock control logic as part of the design process and/or (ix) be implemented on one or more integrated circuits.

Embodiments of the invention generally provide scan-based at-speed transition testing. The transition testing may be used to detect and screen timing defects within fabricated systems-on-a-chip (SOCs) and integrated circuits (ICs). Pulses generated by clock control circuitry of the invention may be used to detect transition faults between and within synchronous divided clock domains. An initial transition of the initial pulses in each clock domain may be synchronized with each other. The inter-clock domain transition defect coverage generally allows for identification of timing defects between that clock domains that may otherwise be missed. In some embodiments, the clock control circuitry may use single divided clocks to generate the pulses. In other embodiments, the clock control circuitry may be extended to multiple versions of divided clocks (e.g., clock, clock/2, clock/4, . . . , clock/N). The clock control circuitry may be triggered by dedicated launch trigger that provides additional flexibility for timing closure. Example designs of the invention may be physical-design friendly and may help minimize an extra impact of handling clock control logic as part of a physical design process.

Figure 1:
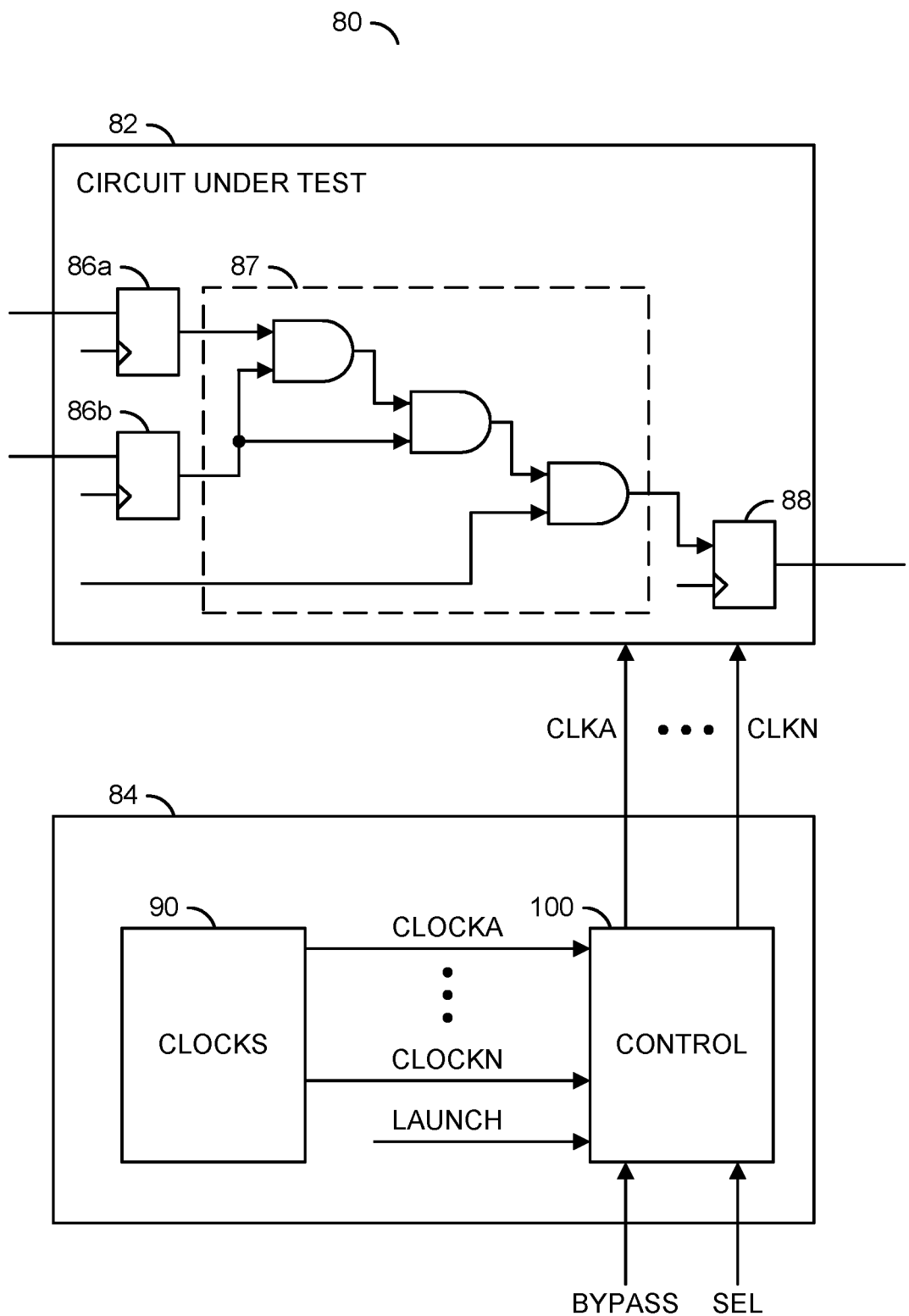
FIG. 1 is a diagram of a system illustrating a context of the invention in accordance with an embodiment of the invention.

Referring to FIG. 1, a diagram of a system 80 illustrating a context of the invention is shown in accordance with an embodiment of the invention. The system (or circuit) 80 generally comprises a block (or circuit) 82 and a block (or circuit) 84. The circuit 82 may comprise multiple blocks (or circuits) 86a to 86b, a block (or circuit) 87 and one or more blocks (or circuits) 88. The circuit 84 generally comprises a block (or circuit) 90, and a block (or circuit) 100. The circuits 82 to 100 may be implemented with hardware and/or simulated with software executing on hardware. In an example embodiment, the system 80 may be implemented in one or more integrated circuits (or chips).

A set of signals (e.g., CLOCKA to CLOCKN) may be generated by the circuit 90 and presented to the circuit 100. The signal CLOCKA may implement a main clock signal in a fastest clock domain. The signal CLOCKB may implement a divided clock signal (e.g., CLOCKB=CLOCKA/2) in a divided clock domain. The signal CLOCKC may implement another divided clock signal (e.g., CLOCKC=CLOCKA/4) in another clock domain. The signal CLOCKD may implement a divided clock signal (e.g., CLOCKD=CLOCKA/8). The signal CLOCKN may implement a divided clock signal (e.g., CLOCKN=CLOCKA/N) in a slowest clock domain, where N is an integer power of two (e.g., $N=2^1, 2^2, 2^3, 2^4, 2^5$, etc.).

A set of signals (e.g., CLKA to CLKN) may be generated by the circuit 100 and transferred to the circuit 84. The signal CLKA may be a mode-switchable version of the signal CLOCKA in the fastest clock domain. During a normal mode of operation, the signal CLKA may match the signal CLOCKA. During transition testing, the signal CLKA may convey test pulses based on the frequency of the signal CLOCKA. The signal CLKB may be a mode-switchable version of the signal CLOCKB in the divided clock domain. During the normal mode of operation, the signal CLKB may match the signal CLOCKB. During transition testing, the signal CLKB may convey test pulses based on the frequency of the signal CLOCKB. The signal CLKC may be a mode-switchable version of the signal CLOCKC in the corresponding clock domain. During the normal mode of operation, the signal CLKC may match the signal CLOCKC. During transition testing, the signal CLKC may convey test pulses based on the frequency of the signal CLOCKC. The signal CLKN may be a mode-switchable version of the signal CLOCKN in the slowest clock domain. During the normal mode of operation, the signal CLKN may match the signal CLOCKN. During transition testing, the signal CLKN may convey test pulses based on the frequency of the signal CLOCKN.

A launch signal (e.g., LAUNCH) may be received by the circuit 100. The signal LAUNCH may be a dedicated signal (e.g., not a shared signal), used to initiate an inter-clock domain transition test in the circuit 82 while in the transition testing mode of operation. A signal (e.g., BYPASS) may be received by the circuit 100. The signal BYPASS may be used to control the generation of the signals CLKA to CLKN in either the normal mode of operation or the transition testing mode of operation. A signal (e.g., SEL) may be received by the circuit 100. The signal SEL may be a multiple-bit signal that controls the number of pulses generated in the signals CLKA to CLKN during the transition testing mode of operation. In various configurations, the signal SEL may command that a single pulse, two pulses, or three pulses be generated in each signal CLKA to CLKN. The generation of three pulses in each signal CLKA to CLKN may be useful where the circuit 82 has an extra sequential depth beyond simple full-scan type inputs and outputs.

The circuit 82 may implement a circuit (or device) under test. The circuit 82 is generally operational to perform various logical operations. The circuit under test 82 may utilize the signals CLKA to CLKN and operate in the multiple clock domains.

The circuit 84 may implement a clock circuit. The circuit 84 is generally operational to generate the clock signals CLKA to CLKN. In the normal mode of operation, the signals CLKA to CLKN may be continuously-running clocks. In the transition testing mode of operation, the signals CLKA to CLKN may generate the launch pulses in synchronization with each other. In some selected configurations, the circuit 84 may also generate the capture pulses in the signals CLKA to CLKN during the transition testing mode of operation.

Each circuit 86a to 86b may implement one or more flip-flops (or latches). The circuits 86a to 86b are generally operational to capture data for input signals that drive the circuit 87. Each circuit 86a to 86b may be controlled by a corresponding launch pulse in the signals CLKA to CLKN to initiate a data transition through the circuit 87.

The circuit 87 may implement a logic circuit. The circuit 87 is generally operational to perform one or more logical operations on the data received from the flip-flops 86a to 86n. One or more output signals generated by the logical operations may be presented to the circuit 88.

The circuit 88 may implement a flip-flop (or latch). The circuit 88 may be operational to capture the output data generated by the circuit 87. The circuit 88 may be controlled by a corresponding capture (or last) pulse in one of the signals CLKA to CLKN to capture the data transition through the circuit 87.

The circuit 90 may implement a clock generator circuit. The circuit 90 is generally operational to generate the clock signals CLOCKA to CLOCKN in the respective clock domains. In some embodiments, the signals CLOCKA to CLOCKN may be synchronous with each other. For example, the signal CLOCKB may be an integer-divided version of the signal CLOCKA, the signal CLOCKC may be another integer-divided version of the signal CLOCKA or CLOCKB, and so on.

The circuit 100 may implement a control circuit. The circuit 100 is generally operational to control generation of the signals CLKA to CLKN. The mode of generating the clock signals may be based on the signal BYPASS. In the normal mode, the signal BYPASS may be asserted and the signals CLKA to CLKN follow the signals CLOCKA to CLOCKN. In the transition testing mode, the signal BYPASS may be deasserted and the control circuit 100 may generate the launch pulses and possibly the capture pulses in the signals CLKA to CLKN. Initiation of the pulses may be triggered upon assertion of the signal LAUNCH. The number of pulses in each signal CLKA to CLKN may be determined by a select value received in the signal SEL. The select value may be configured to command the generation of one, two or three pulses in each signal CLKA to CLKN.

Figure 2:
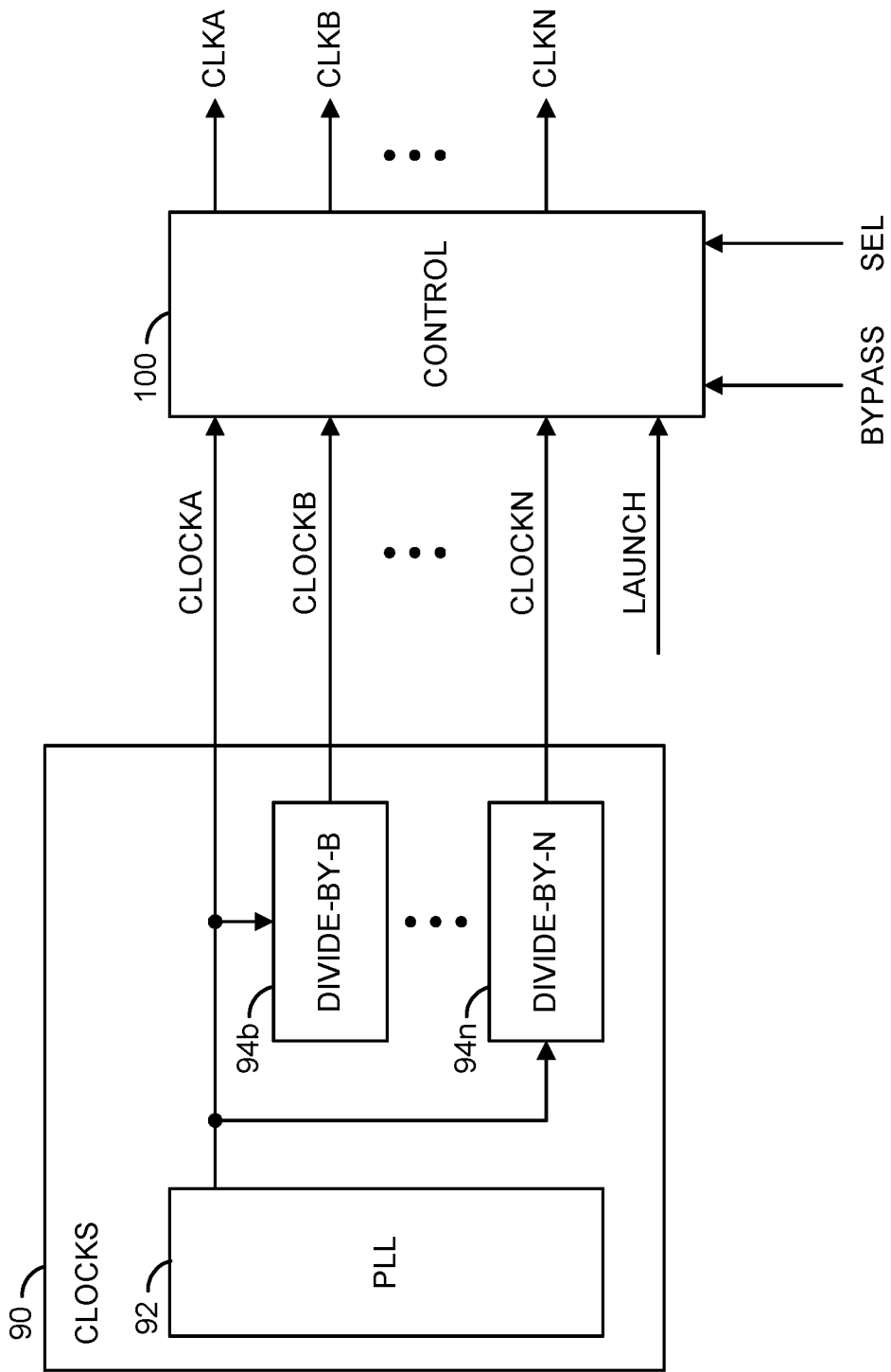
FIG. 2 is a diagram of a clock generation circuit in accordance with an embodiment of the invention.

Referring to FIG. 2, a diagram of an example implementation of the clock generation circuit 90 is shown in accordance with an embodiment of the invention. The clock generation circuit 90 generally comprises a block (or circuit) 92 and multiple blocks (or circuits) 94b to 94n. The circuits 92 to 94n may be implemented with hardware and/or simulated with software executing on hardware. The signal CLOCKA may be generated by the circuit 92 and transferred to the circuits 94b to 94n and the circuit 100. The circuits 94b to 94n may generate the signals CLOCKB to CLOCKN.

The circuit 92 may implement a phase-locked loop (PLL) circuit. The circuit 92 is generally operational to generate the signal CLOCKA. In various embodiments, the signal CLOCKA may be created as a free-running clock. In some configurations, a frequency of the signal CLOCKA may be 200 MHz or greater. Other frequencies of the signal CLOCKA may be implemented to meet the design criteria of a particular application.

Each circuit 94b to 94n may implement a divider circuit. The circuits 94b to 94n are generally operational to divide the signal CLOCKA by a respective integer to generate the signals CLOCKB to CLOCKN. The circuit 94b may implement a divide-by-B circuit. The circuit 94c may implement a divide-by-C circuit. The circuit 94n may implement a divide-by-N circuit. In an example embodiment, the divide-by value B may be two, the divide-by value C may be four, the divide-by value D may be eight, and the divide-by N value may be $2^N$. Other numbers of circuits 94b to 94n and other divide-by values may be implemented to meet the design criteria of a particular application.

Figure 3:
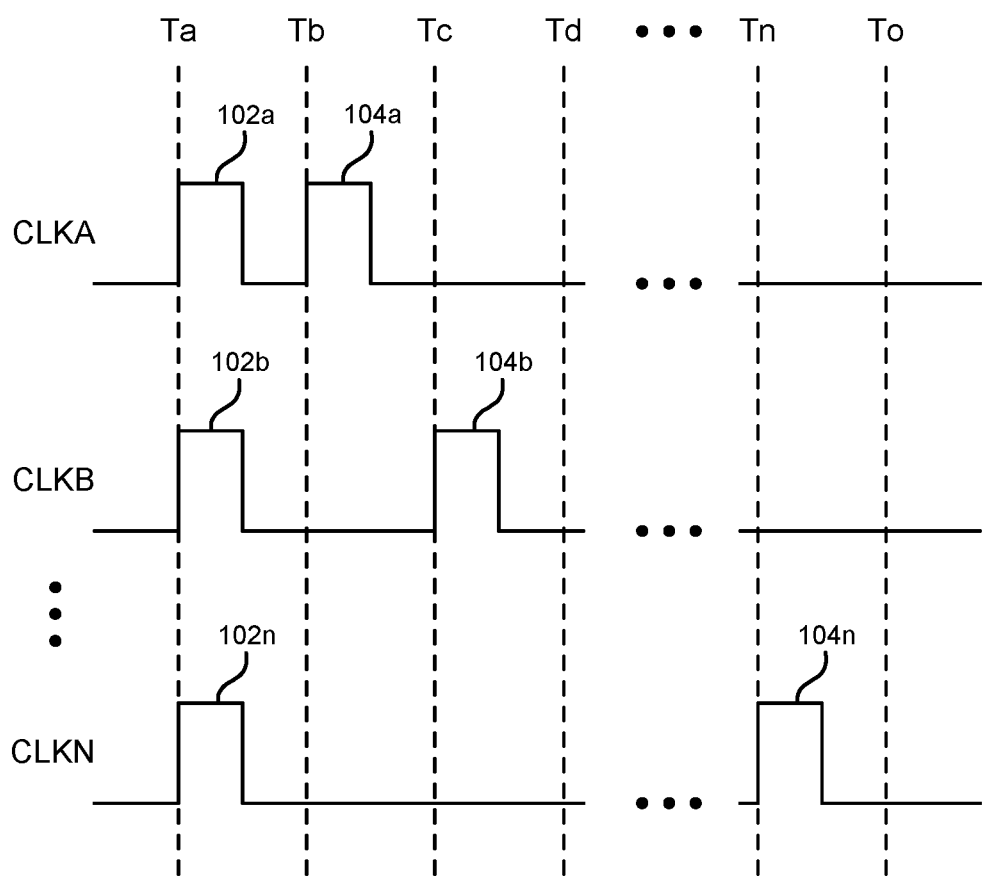
FIG. 3 is a diagram of waveforms generated in a transition testing mode in accordance with an embodiment of the invention.

Referring to FIG. 3, a diagram of example two-pulse waveforms generated in the transition testing mode is shown in accordance with an embodiment of the invention. Each time Ta through To may indicate the start of a new period in the fastest frequency domain (e.g., the frequency domain of the clock CLOCKA).

The control circuit 100 may generate launch pulses (e.g., logically high pulses) 102a to 102n in each signal CLKA to CLKN at the same time (e.g., a time Ta) in an initial period between Ta to Tb. A capture pulse 104a in the fastest domain may be generated in the signal CLKA starting in a next period (e.g., at a time Tb). During the next period between Tb and Tc, the other signals CLKB to CLKN may remain inactive (e.g., no pulses). After the capture pulse 104a has completed, the signal CLKA may remain inactive for the remainder of the transition testing mode.

A capture pulse 104b may be generated in the next fastest clock domain in the signal CLKB during a subsequent period (e.g., at a time Tc). During the subsequent period between Tc and Td, the other signals CLKA and CLKC to CLKN may remain inactive. After the capture pulse 104b has completed, the signal CLKB may remain inactive for the remainder of the transition testing mode.

The capture pulses 104c to 104m may be generated in order until a capture pulse 104n is generated in the slowest clock domain in the signal CLKN (e.g., at a time Tn). During the period between Tn and To, the other signals CLKA to CLKM may remain inactive. After the capture pulse 104n has completed, the signal CLKN may remain inactive for the remainder of the transition testing mode.

Figure 4:
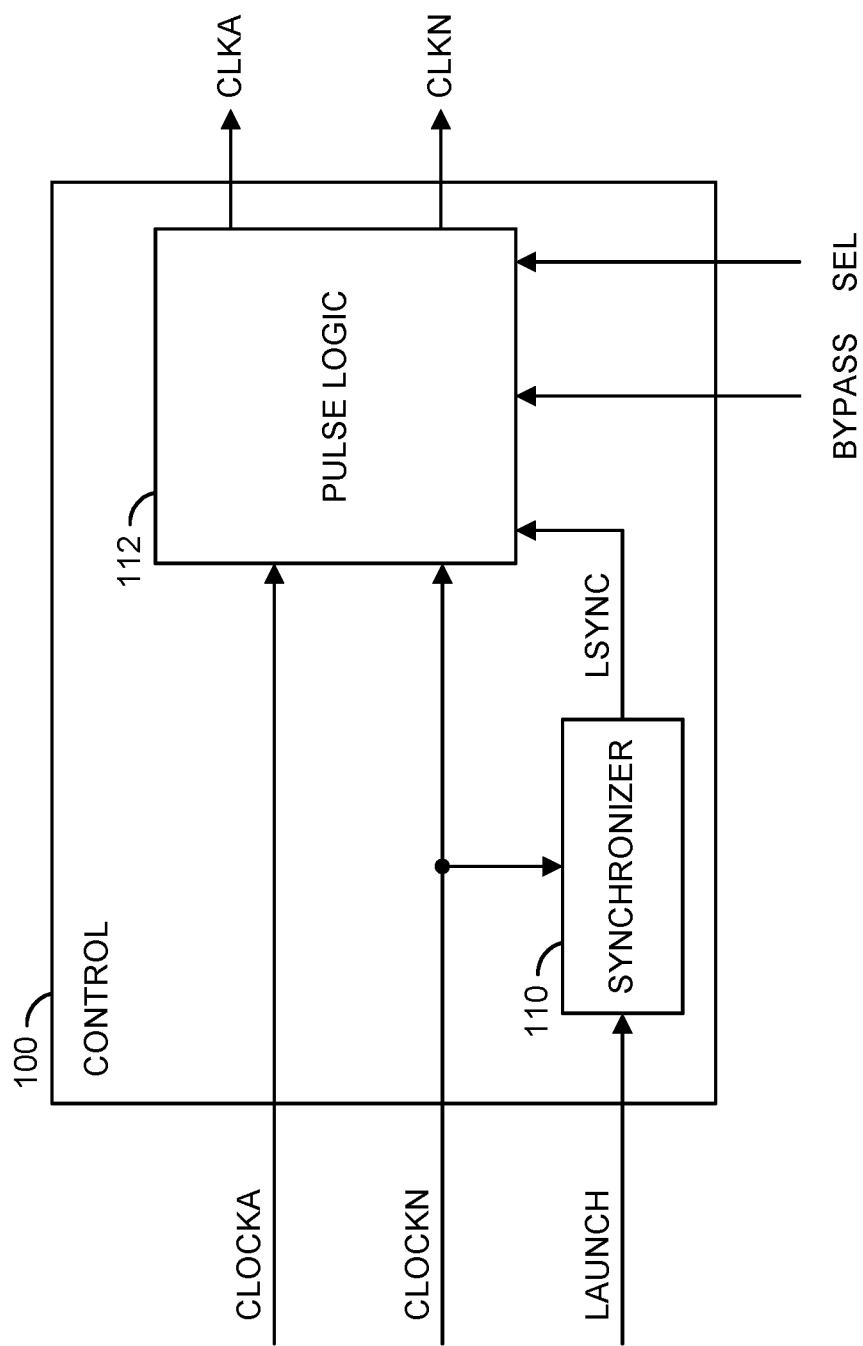
FIG. 4 is a diagram of a control circuit in accordance with an embodiment of the invention.

Referring to FIG. 4, a diagram of an example implementation of the control circuit 100 is shown in accordance with an embodiment of the invention. The control circuit 100 generally comprises a block (or circuit) 110 and a block (or circuit) 112. The circuits 110 to 112 may be implemented with hardware and/or simulated with software executing on hardware.

The signal CLOCKA may be received by the circuit 104. The signal CLOCKN may be received by the circuit 110 and the circuit 112. The signals BYPASS and SEL may be received by the circuit 112. The circuit 112 may generate and present the signals CLKA and CLKN. A signal (e.g., LSYNC) may be generated by the circuit 110 and transferred to the circuit 112. The signal LSYNC may be a version of the signal LAUNCH synchronized to the slowest clock received by the control circuit 100 (e.g., synchronized to the signal CLOCKN).

The circuit 110 may implement a synchronizer circuit. The circuit 110 is generally operational to synchronize the signal LAUNCH to the signal CLOCKN to create the signal LSYNC. The signal LSYNC may be presented to the circuit 112.

The circuit 112 may implement a pulse logic circuit. The circuit 112 is generally operational to generate the signals CLKA to CLKN based on the signals CLOCKA to CLOCKN, LSYNC, BYPASS and SEL. In various embodiments, the circuit 112 may comprise a plurality of hardwired logic gates. The signal BYPASS may be used to control the generation of the signals CLKA to CLKN in either the normal mode of operation or the transition testing mode of operation. The signal SEL may be used to control the number of sequential pulses generated in each signal CLKA to CLKN while in the transition testing mode.

Figure 5:
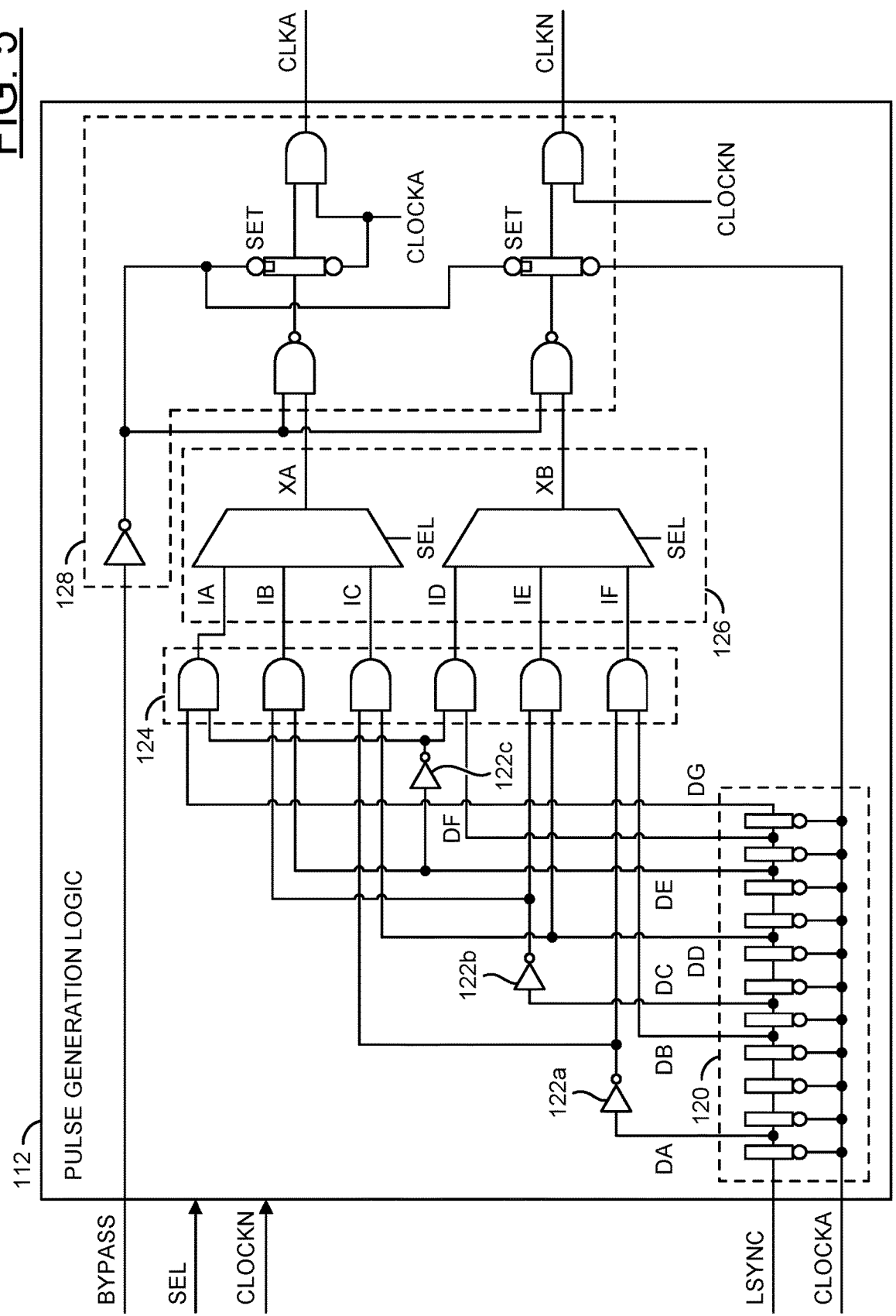
FIG. 5 is a diagram of a pulse logic circuit in accordance with an embodiment of the invention.

Referring to FIG. 5, a diagram of an example implementation of the pulse logic circuit 112 is shown in accordance with an embodiment of the invention. The pulse logic circuit 112 generally comprises a block (or circuit) 120, one or more blocks (or circuits) 122a to 122c, a block (or circuit) 124, a block (or circuit) 126 and a block (or circuit) 128. The circuits 120 to 128 may be implemented with hardware and/or simulated with software executing on hardware.

The signal BYPASS may be received by the circuit 128. The signal SEL may be received by the circuit 126. The signal CLOCKN may be received by the circuit 128. The signal LSYNC may be received by the circuit 120. The signal CLOCKA may be received by the circuit 120 and the circuit 128. The signals CLKA and CLKN may be generated and presented by the circuit 128.

A set of signals (e.g., DA to DG) may be generated by the circuit 120 and presented to the circuits 122a to 122c and the circuit 124. The signals DA to DG may convey delayed versions of the signal LSYNC. A set of signals (e.g., IA to IF) may be generated by the circuit 124 and presented to the circuit 126. The intermediate signals IA to IF may carry potential pulses to be presented in the signals CLKA and CLKN. A set of signals (e.g., XA and XB) may be generated by the circuit 126 and presented to the circuit 128. The signals XA and XB may implement internal clock signals that carry selected pulses to be presented in the signals CLKA and CLKN while in the transition testing mode.

The circuit 120 may implement a shift register circuit. The circuit 120 is generally operational to generate the signals DA to DG by time shifting the signal LSYNC a number of times. The shifting may be clocked by the fastest clock signal (e.g., the signal CLOCKA). The signal DA may represent the signal LSYNC delayed by a single cycle of the signal CLOCKA. The signal DB may represent the signal LSYNC delayed by four cycles of the signal CLOCKA. The signal DC may represent the signal LSYNC delayed by five cycles of the signal CLOCKA, and so on. Other numbers of the signals DA to DG and/or other delays of the signals DA to DG may be implemented to meet the design criteria of a particular application.

Each circuit 122a to 122c may implement an inverter circuit. The circuit 122a is generally operational to invert the signal DA. The circuit 122b may invert the signal DC. The circuit 122c may invert the signal DE. Other numbers of circuits 122a to 122c may be implemented to meet the design criteria of a particular application.

The circuit 124 may implement a set of logical AND gates. The gates within the circuit 124 are generally operational to generate the signals IA to IF by a Boolean AND of two of the delayed signals DA to DG (after some of the signals DA to DG have been inverted). A combination of the delays, selective inverting and the Boolean AND functions generally create a set of potential pulses for each signal CLKA and CLKN. The potential pulses may be grouped into sets of pulse pairs, half of each pulse pair driving the corresponding signals CLKA and CLKN.

The circuit 126 may implement a set of multiplexer circuits. Each multiplexer within the circuit 126 is generally operational to route a subset of multiple intermediate signals IA to IF received from the circuit 124 based on the signal SEL to create one of the signals XA or XB. The signal SEL may be used by the multiplexers to select one of the pair sets from among the signals IA to IF. The selection may result in a sequence of one pulse, two pulses or three pulses in each signal CLKA and CLKN.

The circuit 128 may implement a mode logic circuit. The circuit 128 is generally operational to control the mode of operation of the circuit 100 based on the signal BYPASS. In the normal mode, the signal BYPASS may be asserted and the signals CLKA and CLKN follow the signals CLOCKA and CLOCKN, respectively. A common input node to each of the NAND gates may be held at a logical low level such that multiple NAND gates (e.g., a NAND gate per signal CLKA to CLKN) always present a logical high level signal. The SET input nodes of multiple flip-flops (e.g., a flip-flop per signal CLKA to CLKN) may be asserted to the logical low level so that the flip-flops may be held in the set condition and present logical high signals. The logical high signals from the flip-flops may hold one of the input nodes of multiple AND gate (e.g., an AND gate per signal CLKA to CLKN) at the logically high level such that the AND gates pass the signals CLOCKA and CLOCKN as the signals CLKA and CLKN, respectively.

In the transition testing mode, the signal BYPASS may be deasserted and the control circuit 100 may generate the launch pulses and possibly the capture pulses in the signals CLKA and CLKN. The common input nodes to each of the NAND gates may be held at the logical high level such that the NAND gates invert the signals XA and XB. The SET input nodes of the flip-flops may be deasserted while logically high such that the flip-flops sample and hold the inverted signals XA and XB in each cycle of the signal CLOCKA. The AND gates may synchronize the pulses presented from the flip-flops with the signals CLOCKA and CLOCKN, respectively.

The structure of the circuit 128 with the signal BYPASS signal going into the SET input nodes of the flip-flops, and the flip-flops feeding the AND gates may result in a circuit design that is easier for physical implementation than common designs with the two functions of clock-gating and bypass. Common implementations of the two functions involves latching, gating and multiplexing operations. The circuit 128 may eliminate the extra multiplexing make for easier physical designs.

The functions and structures illustrated in the diagrams of FIGS. 1 to 5 may be designed, modeled, emulated, and/or simulated using one or more of a conventional general purpose processor, digital computer, microprocessor, microcontroller, distributed computer resources and/or similar computational machines, programmed according to the teachings of the present specification, as will be apparent to those skilled in the relevant art(s). Appropriate software, firmware, coding, routines, instructions, opcodes, microcode, and/or program modules may readily be prepared by skilled programmers based on the teachings of the present disclosure, as will also be apparent to those skilled in the relevant art(s). The software is generally embodied in a medium or several media, for example non-transitory storage media, and may be executed by one or more of the processors sequentially or in parallel.

Embodiments of the present invention may also be implemented in one or more of ASICs (application specific integrated circuits), FPGAs (field programmable gate arrays), PLDs (programmable logic devices), CPLDs (complex programmable logic device), sea-of-gates, ASSPs (application specific standard products), and integrated circuits. The circuitry may be implemented based on one or more hardware description languages. Embodiments of the present invention may be utilized in connection with flash memory, nonvolatile memory, random access memory, read-only memory, magnetic disks, floppy disks, optical disks such as DVDs and DVD RAM, magneto-optical disks and/or distributed storage systems.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to embodiments thereof, it will be understood by those skilled in the art that various changes in form and details may be made without departing from the scope of the invention.

The invention claimed is:

1. An apparatus comprising:
a first circuit configured to generate a launch signal synchronized with a first clock signal in a first clock domain; and
a second circuit configured to (i) receive a second clock signal in a second clock domain and (ii) generate a plurality of pulses in each of a third clock signal and a fourth clock signal based on said second clock signal and said launch signal, wherein (a) a frequency of said pulses in said fourth clock signal is an integer multiple of another frequency of said pulses in said third clock signal, (b) an initial one of each of said pulses in said third clock signal and said fourth clock signal are synchronized with each other and (c) said generation of said launch signal is in response to a dedicated signal and said first clock signal.

2. The apparatus according to claim 1, wherein an initial pulse in said fourth clock signal launches a start of a logical operation in a third circuit.

3. The apparatus according to claim 2, wherein a last one of said pulses in said third clock signal captures an end of said logical operation in said third circuit to capture an inter-clock domain transition defect in said logical operation.

4. The apparatus according to claim 1, wherein said integer multiple is one of two, four or eight.

5. The apparatus according to claim 1, wherein said second circuit comprises a shift register configured to delay said launch signal a plurality of times relative to said second clock signal to generate a plurality of delayed signals.

6. The apparatus according to claim 5, wherein said second circuit further comprises a plurality of logic gates configured to generate a plurality of intermediate signals based on said delayed signals.

7. The apparatus according to claim 6, wherein said second circuit further comprises a plurality of multiplexers configured to select a subset less than all of said intermediate signals to generate a plurality of internal clock signals.

8. The apparatus according to claim 7, wherein said second circuit further comprises a logic circuit configured to generate said third clock signal and said fourth clock signal based on said internal clock signals.

9. The apparatus according to claim 8, wherein said logic circuit is further configured to generate both of said third clock signal and said fourth clock signal without said pulses in response to a bypass signal.

10. The apparatus according to claim 9, wherein said logic circuit comprises (i) a plurality of flip-flops each configured to receive said bypass signal at a set input node and generate an intermediate signal, (ii) a first gate configured to generate said third clock signal as a Boolean AND of one of said intermediate signals and said first clock signal and (iii) a second gate configured to generate said fourth clock signal as another Boolean AND of another of said intermediate signals and said second clock signal.

11. A method for generating synchronized clocks to detect inter-clock domain transition defects, comprising the steps of:
generating a launch signal synchronized with a first clock signal in a first clock domain;
receiving a second clock signal in a second clock domain at a circuit; and generating a plurality of pulses in each of a third clock signal and a fourth clock signal based on said second clock signal and said launch signal, wherein (a) a frequency of said pulses in said fourth clock signal is an integer multiple of another frequency of said pulses in said third clock signal, (b) an initial one of each of said pulses in said third clock signal and said fourth clock signal are synchronized with each other and (c) said generation of said launch signal is in response to a dedicated signal and said first clock signal.

12. The method according to claim 11, wherein an initial pulse in said fourth clock signal launches a start of a logical operation in a circuit under test.

13. The method according to claim 12, wherein a last one of said pulses in said third clock signal captures an end of said logical operation to capture an inter-clock domain transition defect in said logical operation.

14. The method according to claim 11, wherein said integer multiple is one of two, four or eight.

15. The method according to claim 11, further comprising the step of:
delaying said launch signal a plurality of times relative to said second clock signal to generate a plurality of delayed signals.

16. The method according to claim 15, further comprising the step of:
generating a plurality of intermediate signals based on said delayed signals.

17. The method according to claim 16, further comprising the step of:
selecting a subset less than all of said intermediate signals to generate a plurality of internal clock signals.

18. The method according to claim 17, wherein said third clock signal and said fourth clock signal are generated based on said internal clock signals.

19. The method according to claim 18, wherein both of said third clock signal and said fourth clock signal are generated without said pulses in response to a bypass signal.

20. An apparatus comprising:
a first circuit configured to generate a launch signal synchronized with a first clock signal in a first clock domain; and
a second circuit configured to (i) receive a second clock signal in a second clock domain, (ii) generate a plurality of pulses in each of a third clock signal and a fourth clock signal based on said second clock signal and said launch signal, (iii) generate a plurality of internal clock signals and (iv) generate said third clock signal and said fourth clock signal based on said internal clock signals without said pulses in response to a bypass signal, wherein (a) a frequency of said pulses in said fourth clock signal is an integer multiple of another frequency of said pulses in said third clock signal and (b) an initial one of each of said pulses in said third clock signal and said fourth clock signal are synchronized with each other.

* * * * *